United States Patent
Martin et al.

(10) Patent No.: US 6,297,703 B1
(45) Date of Patent: Oct. 2, 2001

(54) METHOD AND APPARATUS FOR PRODUCING AN OFFSET FREQUENCY

(75) Inventors: Frederick L. Martin; Gregory S. Raven, both of Plantation; Jeffrey A. Rollman, Boca Raton, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/653,975

(22) Filed: Sep. 1, 2000

(51) Int. Cl.$^7$ .............................. H03L 7/07; H03L 7/18
(52) U.S. Cl. .................. 331/2; 331/1 A; 331/16; 331/18; 327/147; 327/150; 327/156; 327/159; 375/376; 455/260
(58) Field of Search ............... 331/1 A, 2, 16, 331/18, 25; 327/147–150, 156–159; 375/376; 455/260

(56) References Cited

U.S. PATENT DOCUMENTS

| | | | |
|---|---|---|---|
| 3,792,443 | * | 2/1974 | Breikss ............................ 340/172.5 |
| 4,225,829 | * | 9/1980 | Kumagai ............................ 331/1 A |
| 5,019,785 | * | 5/1991 | Fognini et al. ........................ 328/14 |
| 5,034,703 | * | 7/1991 | Schumacher ............................ 331/2 |
| 5,757,239 | * | 5/1998 | Gilmore ................................ 331/18 |

OTHER PUBLICATIONS

Norris, M.H., "The Design of Digital Cellular Handsets," Transmitter Architectures, pp. 4/1–4/6, IEE Colloquium, Mar. 1998, Savoy Place, London WC2R 0BL, UK.

* cited by examiner

*Primary Examiner*—David Mis
(74) *Attorney, Agent, or Firm*—Randi L. Dulaney

(57) ABSTRACT

A frequency generation device (100) comprises a cascade of two phase-locked loops (104 and 108). The first PLL (104) is a frequency synthesizer while the second PLL, or offset loop (108), comprises a phase detector (208 or 306), loop filter (210 or 310), VCO (212 or 312) and a divider with near-unity modulus (204 or 308). In the case of a negative offset design, the near-unity divider (204) is placed in the offset loop feedback path. In a positive offset design, the near-unity divider (308) is placed in the path between the synthesizer VCO and the offset loop phase detector. Unlike existing art, there is no offset signal input to the second or offset loop (108).

12 Claims, 4 Drawing Sheets

METHOD AND APPARATUS FOR PRODUCING AN OFFSET FREQUENCY

TECHNICAL FIELD

This invention relates in general to electrical circuits, and more specifically to an apparatus for producing an offset frequency.

BACKGROUND

Typically in a two-way radio, a frequency synthesizer is used to generate a receive local oscillator (LO) signal and a transmit carrier. The frequency bands for receive and transmit operation may or may not be the same for the two-way radio. Differences may result from the receiver architecture (e.g., superheterodyne), system design (e.g., separate frequency blocks for transmit and receive signals) or transmitter architecture (e.g., frequency offset). When the radio's transmitter is operative, high levels of radio frequency signals are radiated back into the radio from the antenna. This tends to cause several modes of self-interference of the transmitter.

Two approaches are currently used to meet the requirements of this radio environment. These approaches are the offset loop and the image-balanced mixer. In the offset loop approach, a phase-locked loop (PLL) comprising a phase detector, loop filter, voltage-controlled oscillator (VCO), offset mixer and offset signal source are connected between the synthesizer output and the input of the transmitter gain and linearization path. The offset loop shifts the output frequency of the synthesizer VCO by an amount equal to the offset signal frequency. A wide loop bandwidth in the offset loop provides immunity to the offset loop VCO from transmit energy. The loop also tends to limit spurious responses caused by the presence of the offset signal.

The offset loop approach has the limitation that in order to minimize the spurious response of the offset loop due to unwanted mixing products, the mixer must be operated such that its response is highly linear. This tends to increase power consumption and limits the noise floor of the system. Another limitation of the offset loop approach is that an additional signal must be provided to the system. Generation of the offset signal increases the cost of the design as well as increases the power consumption for the radio. Also, the presence of the offset signal creates an opportunity for a spurious output of the loop that is only mitigated by the action of the PLL.

In the image-balanced mixer approach, the synthesizer output is mixed with an offset signal and no loop is used to remove spurs from the output. This design is limited to use in systems where the transmit frequency range is much smaller than the offset frequency. A multi-pole filter is required to remove the offset and higher order spurs from the mixer output. The filter however adds cost to the design and constrains the operating frequency range of the transmitter. A need thus exists in the art for a means of generating a carrier frequency without use of an offset signal or mixer based use of an offset loop while minimizing noise in the spectrum of the offset signal.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
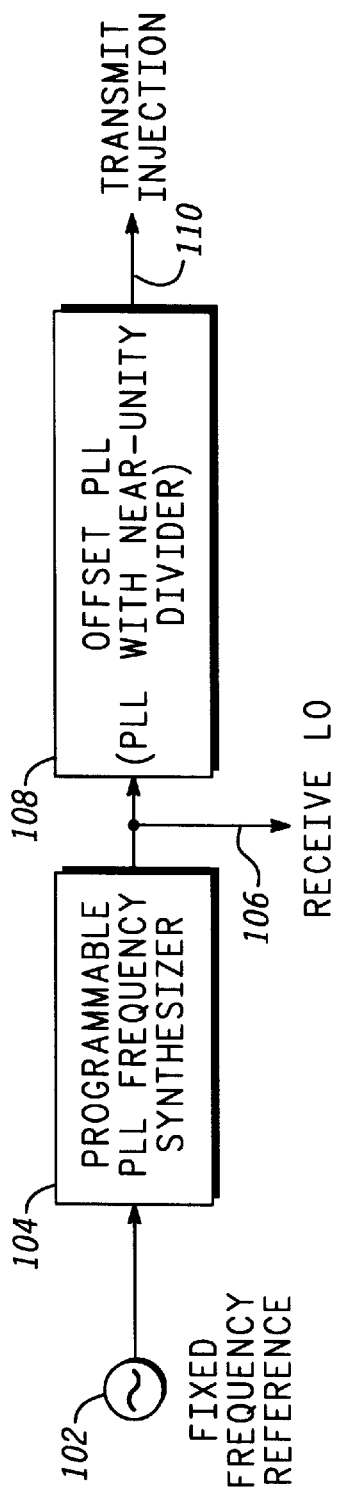
FIG. 1 shows a frequency generation system in accordance with the present invention.

While the specification concludes with claims defining the features of the invention that are regarded as novel, it is believed that the invention will be better understood from a consideration of the following description in conjunction with the drawing figures, in which like reference numerals are carried forward.

The invention comprises a frequency generation system for a radio communication device. Referring now to FIG. 1, there is shown a frequency generation system 100 in accordance with the invention comprising two phase-locked loops. The first loop is a frequency synthesizer 104 with the standard components including a reference frequency source 102, VCO, phase detector, loop filter and divider. It is recognized that the first PLL may also include a multiplier or divider at the output to harmonically translate the reference frequency. The output 106 of the first loop may be connected to the receiver first LO injection port found in a radio (the rest of radio circuit is not shown in FIG. 1) and to the reference of a second phase-locked loop 108.

The second phase locked loop 108 is an offset loop that comprises a phase detector, loop filter, VCO, and a divider with near-unity modulus (a near-unity divider). The VCO output 110 of the offset loop 108 is connected to the transmit injection port in the radio (not shown). Unlike existing art, there is no offset signal input to the offset loop 108.

Figure 2:
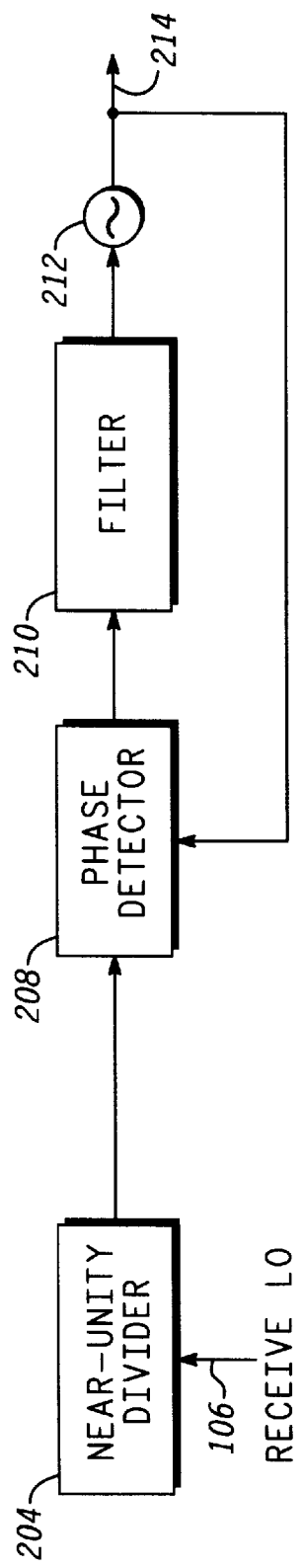
FIG. 2 shows a block diagram of a negative offset multiplying offset loop in accordance with the present invention.
Figure 3:
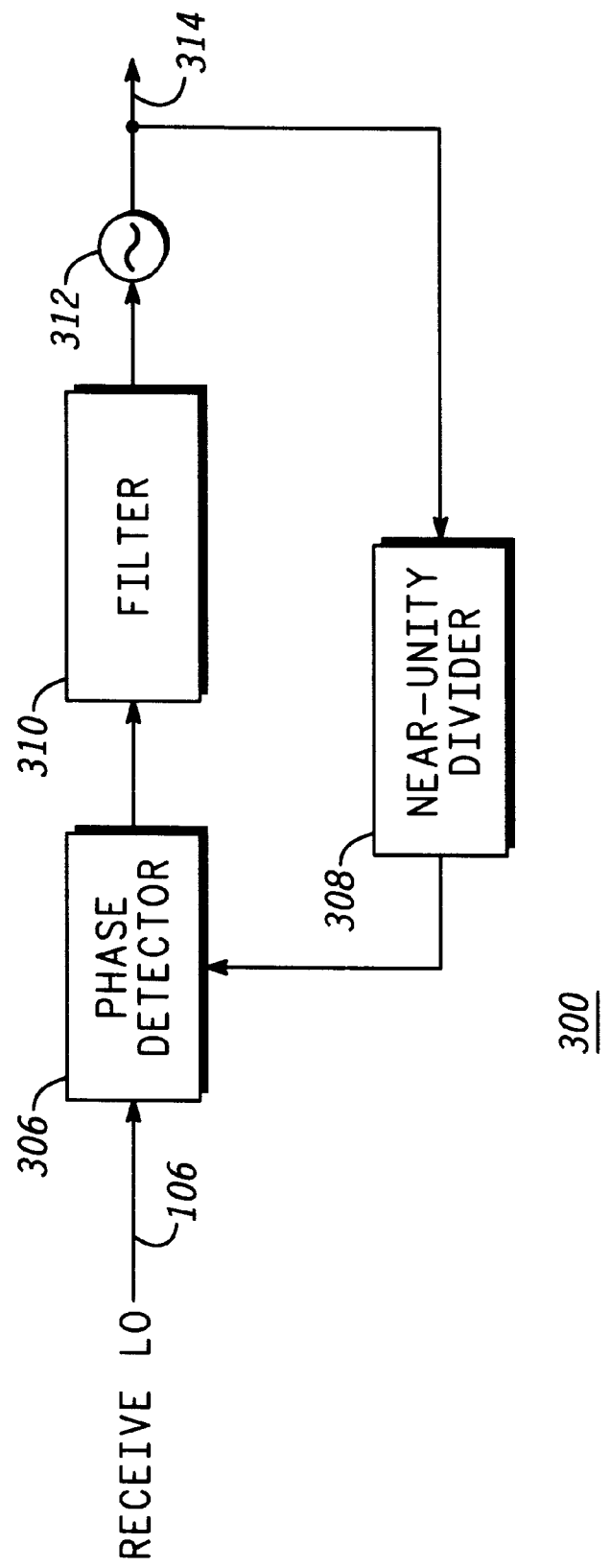
FIG. 3 shows a block diagram of a positive offset multiplying offset loop in accordance with the present invention.

In FIG. 2, a configuration 200 is shown for the offset loop 108 in the case that negative offset is required, while a configuration 300 is shown in FIG. 3 in the case that positive offset is required in a particular design. In radios where the transmit injection frequency range is below the main synthesizer frequency range and a negative offset is needed, the near-unity divider 204 is placed in the path between the main synthesizer output 106 and phase detector 208 (FIG. 2). A loop filter 210 and VCO 212 complete the offset loop 200. In the situation where the main synthesizer frequency range is above the receive LO frequency range, the near-unity divider 308 is placed in the path between the offset loop VCO 312 and the offset loop phase detector 306 as shown in FIG. 3. A loop filter 310 completes the offset loop 300. Note that it is possible to include in a system a switching scheme so that the divider may be positioned in either configuration and switched in as needed. This can be used to add flexibility to the implemented hardware by allowing one design to operate for both negative and positive offset designs. It can also be used in direct conversion receive/transmit systems.

Figure 4:
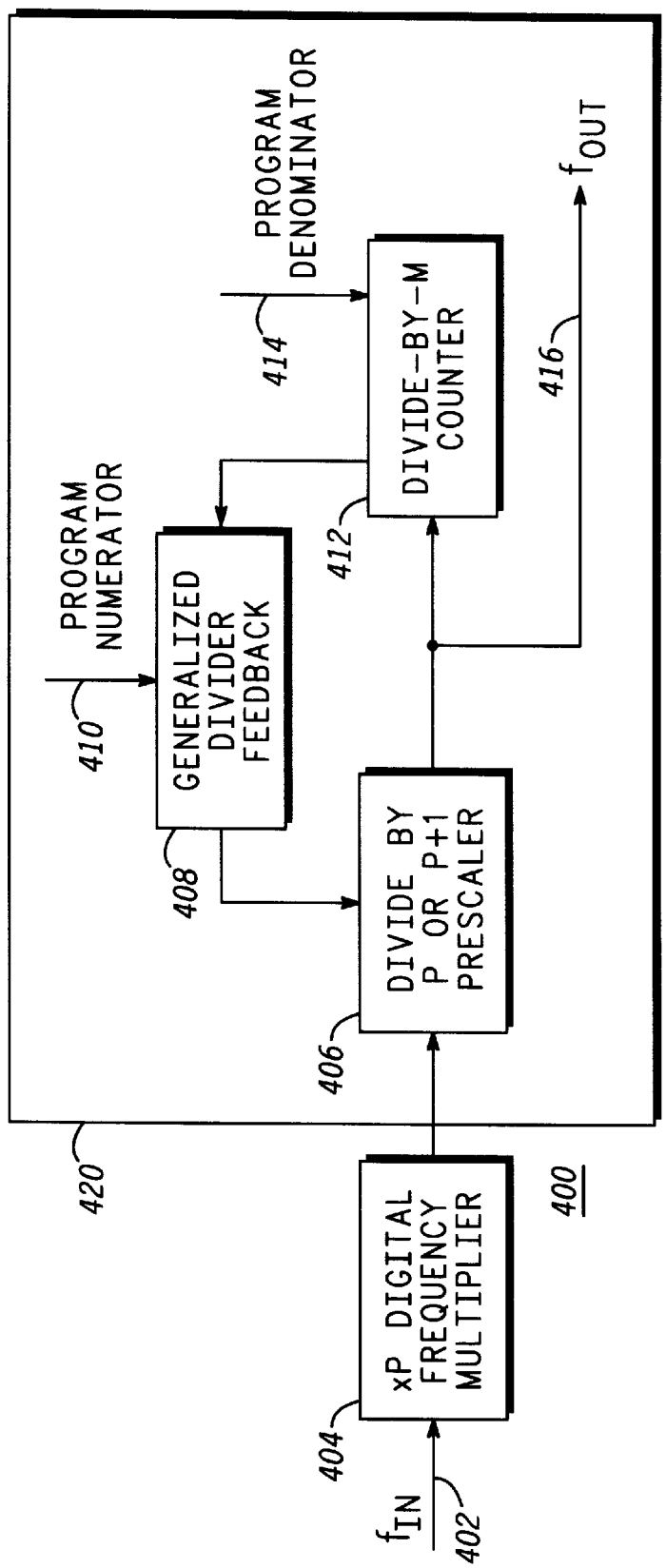
FIG. 4 is a block diagram of a frequency divider with near-unity modulus in accordance with the preferred embodiment.

One of the key aspects of the invention is the near-unity divider 400 shown in FIG. 4 (shown as item 204 in FIG. 2 and item 308 in FIG. 3). The purpose of the divider is to produce a division ratio near unity. It is preferably implemented as shown in FIG. 4 as a programmable divider, but may be alternatively implemented as a fixed divider in specific applications. This near-unity divider 400 comprises a cascade of a frequency multiplier 404 and a fractional divider 420 which is preferably implemented using a divide by P or P+1 prescaler 406, a counter 412 and a generalized divider feedback block 408. The near-unity divider 400 further includes an input port 402 for receiving an input frequency, $f_{in}$, and an output port 416 for providing an output signal, $f_{out}$. By taking the system output at the output of prescaler 406, the three blocks 406, 408 and 412 act as a fractional divider with denominator M. The divide-by-M counter 412 receives a program denominator 414 of value M from the radio controller (not shown), while the generalized divider feedback block 408 receives a program numerator 410 of value Q. Taken together, the blocks 404 and 420 produce a divide ratio (the ratio of input frequency to output frequency) equal to:

$$f_{in}/f_{out}=(1/P)*(PM+Q)/M=(PM+Q/PM) \qquad \text{Equation 1}$$

where "P" represents the modulus of prescaler 406 and the multiplication ratio of multiplier 404, "M" is the modulus of the divider 412, and "Q" is the number of pulses produced by feedback stage 408 during a counter cycle, as described below with reference to FIG. 5. In one implementation of the invention, P was set to 2, M was set to 16, and Q had a range from 0 to 16. Thus, the divider 400 had a range of 1 to 1.5 in steps of 1/32. Note that dividers with other configurations can be implemented without changing the key features of the two-loop invention.

Applying Equation 1 above to the two cases shown in FIGS. 2 and 3, separate expressions for offset loop output frequency, $f_{offset}$, as a function of synthesizer output frequency, $f_{synth}$, depending on the position of the divider are developed. For the case of the circuit shown in FIG. 2, the expression is:

$$f_{offset}=[PM/(PM+Q)]*f_{synth} \qquad \text{Equation 2}$$

For the case of circuit shown in FIG. 3, the expression is:

$$f_{offset}=[(PM+Q)/PM]*f_{synth} \qquad \text{Equation 3}$$

Figure 5:
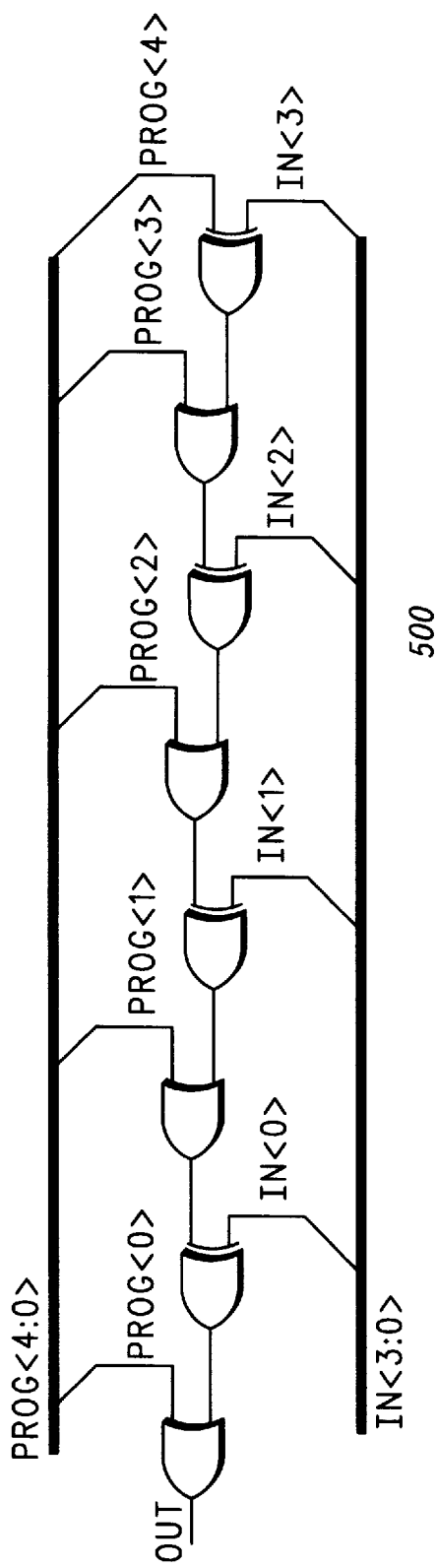
FIG. 5 shows an implementation of a generalized feedback circuit for the frequency divider.

The generalized divider feedback block 408 is preferably realized using a cascaded network of logic gates 500 as shown in FIG. 5. A 4-bit (capable of operating on a 4-stage divide-by-N circuit) implementation of the block is shown. Inputs to the block are a 4-bit input bus (IN<3:0>) and a 5-bit programming bus (prog<4:0>). The single-bit output (OUT) is generated by a cascade of OR and exclusive-OR gates. In operation, during a counter cycle, which is defined by the non-repeating sequence of all possible values on bus IN (16 values for this 4-bit realization), the node out can produce a high logic value on any number of cycles from 0 to 16 depending on the state of bus PROG. Typically, the value of bus PROG is fixed for a given divider programming value. It can be shown that the value of PROG is related to OUT by a Grey Code sequence.

Figure 6:
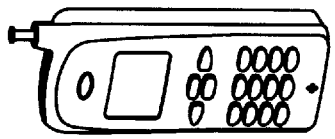
FIG. 6 shows a radio communication device in accordance with the present invention.

In FIG. 6, there is shown a two-way radio 600 which utilizes the frequency generation system 100 of the present invention.

In operation, the invention generates either a receive LO or transmit injection or both simultaneously. Frequency adjustments to the frequency synthesizer PLL, such as FM modulation and reference oscillator warp, pass through the system of the present invention undistorted. The offset PLL produces a frequency that is offset from the synthesizer PLL output frequency. Another advantage of the invention is that the control-loop bandwidth of the synthesizer PLL is relatively low (on order of 100 to 3000 Hz) to filter noise and spurs produced by the frequency generation process. The control-loop bandwidth of the offset loop is wider (up to several MHz) to protect the offset loop VCO from interference produced by proximity to the transmitter antenna.

A further benefit of the invention is that the synthesizer VCO does not operate at the same frequency as the offset loop VCO. This minimizes interference on the synthesizer loop VCO by the transmitter. The offset frequency is provided by the action of the near-unity divider 204 or 308 in the offset loop. One goal of the invention is that the synthesizer VCO frequency range requirement be no more severe than the requirement for the receive LO range (assuming receive and transmit bands have the same fractional bandwidth). This is achieved by adding programmability to the offset divider and by allowing switching of the position of the divider in the offset loop as shown in FIGS. 2 and 3.

Because the offset-loop divider has a gain of near unity, the noise multiplication of the noise inside the offset-loop bandwidth, both from the synthesizer and from sources inside of the offset loop, is minimized. Thus, the output spectrum of the offset loop is dominated by the output noise of the synthesizer. This near-unity approach is the key to designing the offset loop with sufficiently wide control-loop bandwidth to protect from transmit distortion and sufficiently low in-band noise to meet transmitter spectral requirements.

Modifications to the divider offer opportunities for variations on the existing design. Some possible changes are addition of a programmable fractional denominator or conversion to a multi-accumulator fractional division approach.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An apparatus for producing an offset frequency, comprising:
   a first phase-locked loop (PLL) including a frequency synthesizer having an output port; and
   a second phase-locked loop (PLL) including a near-unity divider, and the output port of the first PLL is coupled to the second PLL.

2. An apparatus as defined in claim 1, wherein the output port of the first PLL comprises a voltage controlled oscillator (VCO) output.

3. An apparatus as defined in claim 1, wherein the near-unity divider comprises a cascade of a frequency multiplier and a fractional programmable divider connected together.

4. An apparatus as defined in claim 3, wherein the near-unity divider includes a prescaler, a counter and a feedback stage coupled together and produces a ratio of input frequency to output frequency equal to:

$$f_{in}/f_{out}=(PM+Q)/PM$$

where "P" is the modulus of the prescaler and the multiplier ratio, "M" is the modulus of the counter, and "Q" is the number of the pulses produced during a counter cycle by the feedback stage found in the near-unity divider.

5. An apparatus as defined in claim 3, wherein the fractional programmable divider includes a prescaler, a counter, and a divider feedback.

6. An apparatus as defined in claim 1, wherein the second PLL does not require an offset signal input.

7. A method for producing an offset frequency, comprising the steps of:
   receiving a reference frequency at a frequency synthesizer;
   outputting a synthesizer output signal by the frequency synthesizer;
   providing the synthesizer output signal to an offset phase-locked loop (PLL) having a near-unity divider; and
   providing a transmit injection signal by the offset PLL in response to receiving the synthesizer output signal.

8. A method as defined in claim 7, wherein the near-unity divider found in the offset PLL includes a prescaler, ripple counter and a feedback stage coupled together and produces a ratio of input frequency to output frequency equal to:

$$f_{in}/f_{out}=(PM+Q)/PM$$

where "P" is the modulus of the prerscaler and the multiplier ratio, "M" is the modulus of the ripple counter, and "Q" is the number of the pulses produced by the feedback stage during a counter cycle.

9. A radio, comprising:
   a first phase-locked loop (PLL) including a frequency synthesizer having an output port; and
   a second phase-locked loop (PLL) including a near-unity divider, and the output port of the first PLL is coupled to the second PLL.

10. A radio as defined in claim 9, wherein the second PLL comprises an offset PLL which has no offset signal input.

11. A radio as defined in claim 10, wherein the near-unity divider comprises a cascade of a frequency multiplier and a fractional programmable divider connected together.

12. A radio as defined in claim 11, wherein the near-unity divider includes a prescaler, ripple counter and feedback stage coupled together and produces a ratio of input frequency to output frequency equal to:

$$f_{in}/f_{out}=(PM+Q)/PM$$

where "P" is the modulus of the prerscaler and the multiplier ratio, "M" is the modulus of the ripple counter, and "Q" is the number of the logic high pulses produced during a counter cycle by the feedback stage found in the near-unity divider.

* * * * *